United States Patent
Lu et al.

(10) Patent No.: US 7,646,322 B2
(45) Date of Patent: Jan. 12, 2010

(54) FOLDED R-2R LADDER CURRENT-STEERING DIGITAL TO ANALOG CONVERTER

(75) Inventors: Nan-Ku Lu, Tao-Yuan (TW); Chun-Chieh Chen, Tao-Yuan (TW); Kai-Yao Lin, Tao-Yuan (TW); Yi-Zhi Zeng, Tao-Yuan (TW)

(73) Assignee: Chung Yuan Christian University, Tao-Yuan (TW)

( * ) Notice: Subject to any disclaimer, the term of this patent is extended or adjusted under 35 U.S.C. 154(b) by 16 days.

(21) Appl. No.: 12/204,372

(22) Filed: Sep. 4, 2008

(65) Prior Publication Data
US 2009/0128387 A1     May 21, 2009

(30) Foreign Application Priority Data
Nov. 15, 2007    (TW)  ............................... 96143156 A

(51) Int. Cl.
*H03M 1/78*     (2006.01)

(52) U.S. Cl. ..................................... 341/154; 341/144
(58) Field of Classification Search ................ 341/154, 341/144, 145, 150
See application file for complete search history.

(56) References Cited

U.S. PATENT DOCUMENTS

| | | | | |
|---|---|---|---|---|
| 5,070,331 A | * | 12/1991 | Hisano | ........................ 341/154 |
| 5,084,703 A | * | 1/1992 | Kane | ........................... 341/154 |
| 5,243,347 A | * | 9/1993 | Jackson et al. | ............... 341/144 |
| 6,246,351 B1 | * | 6/2001 | Yilmaz | ........................ 341/145 |
| 7,088,274 B2 | * | 8/2006 | Shill | ........................... 341/144 |

* cited by examiner

*Primary Examiner*—Brian Young
(74) *Attorney, Agent, or Firm*—WPAT, PC; Justin King

(57) ABSTRACT

A folded R-2R ladder current-steering digital-to-analog converter is disclosed. In the folded R-2R ladder current-steering digital-to-analog converter, each node in the R-2R ladder is electrically coupled with a plurality of current sources with different weights. Therefore, the numbers of the resisters and current sources can be reduced, and efficient power saving and the high-speed operation can be achieved.

27 Claims, 3 Drawing Sheets

US 7,646,322 B2

FOLDED R-2R LADDER CURRENT-STEERING DIGITAL TO ANALOG CONVERTER

BACKGROUND OF THE INVENTION

1. Field of the Invention

The present invention generally relates to current-steering digital-to-analog converters and, more particularly, to a folded R-2R ladder current-steering digital-to-analog converter.

2. Description of the Prior Art

High speed current-steering digital-to-analog converters are based on a current-steering structure, which enables direct load driving without the need for a high speed amplifier. Current-steering digital-to-analog converters can be generally classified according to four types of main structures: (1) binary-weighted array; (2) segmented array; (3) R-2R ladder; and (4) partially segmented. Among those, the R-2R ladder type is the simplest and most power efficient.

A conventional current-steering digital-to-analog converter is shown in FIG. 1, which is commonly used as a sub-circuit in a partially segmented current-steering digital-to-analog converter; the reason for such popularity being its structural simplicity. In FIG. 1, the converter includes an end current-steering circuit 10 and N-1 R-2R current-steering circuits 20, forming an N-bit R-2R ladder current-steering digital-to-analog converter. It requires N current steering circuits and N current sources, and each node in the R-2R ladder is electrically connected to only one corresponding current source. Although such converters are frequently used as sub-circuits, they are limited to the application aspect. Few researches have been done that is directed to reducing power consumption and the number of passive components in the R-2R ladder current-steering digital-to-analog converter. Therefore, there is a need for a R-2R ladder current-steering digital-to-analog converter with reduced footprint and power consumption.

SUMMARY OF THE INVENTION

In view of the prior art and the needs of the related industries, the present invention provides that solves the above-mentioned shortcomings of the conventional.

The present invention provides a folded R-2R ladder current-steering digital-to-analog converter. In the folded R-2R ladder current-steering digital-to-analog converter, each node in the R-2R ladder is electrically coupled with a plurality of current sources with different weights. Therefore, the numbers of the resisters and current sources can be reduced, and efficient power saving and the high speed operation can be achieved.

One objective of the present invention is to provide a folded R-2R ladder current-steering digital-to-analog converter, referring to FIG. 2, which includes an end current-steering circuit 30 and a plurality of sequentially arranged R-2R current-steering circuits 40. The end current-steering circuit 30 includes: a first electrical contact C1; a first two-ended circuit element R1; a second electrical contact C2 and a plurality of current sources A. The two ends of the first two-ended circuit element R1 electrically couple between the first contact C1 and the second contact C2. The resistance of the first two-ended circuit element R1 between the first contact C1 and the second contact C2 is a first resistance value. Additionally, each current source has a switching element S electrically coupled to the second contact C2, wherein the switching element S controls the current flowing/not flowing through current source A by turning on/off, respectively. Each of the R-2R current-steering circuits includes: a first contact C1, all first contacts are electrically coupled together (in parallel); a first two-ended circuit element R1; a second contact C2; a second two-ended circuit element R2; a third contact C3, wherein the two ends of the second two-ended circuit element R2 are electrically coupled between the second contact C2 and the third contact C3; and a plurality of current sources A. The resistance of the second two-ended circuit element R2 between the second contact C2 and the third contact C3 is a second resistance value. In the R-2R current-steering circuit, the first resistance value is two times the second resistance value. The first resistance value in a R-2R current-steering circuit is two times the first resistance value in the end current-steering circuit.

Prior to arranging with the end current-steering circuit 30, the plurality of sequential R-2R current-steering circuits 40 form a sequential R-2R circuit network, wherein the third contact C3 of each current-steering circuit electrically couples to the second contact C2 of the following current-steering circuit.

BRIEF DESCRIPTION OF THE DRAWINGS

The accompanying drawings incorporated in and forming a part of the specification illustrate several aspects of the present invention, and together with the description serve to explain the principles of the disclosure. In the drawings.

DETAILED DESCRIPTION OF THE PREFERRED EMBODIMENTS

The present invention is directed to a folded R-2R ladder current steering digital-to-analog converter. Detailed steps and constituents are given below to assist in the understanding the present invention. Obviously, the implementations of the present invention are not limited to the specific details known by those skilled in the art. On the other hand, well-known steps or constituents are not described in details in order not to unnecessarily limit the present invention. Detailed embodiments of the present invention will be provided as follow. However, apart from these detailed descriptions, the present invention may be generally applied to other embodiments, and the scope of the present invention is thus limited only by the appended claims.

Figure 1:
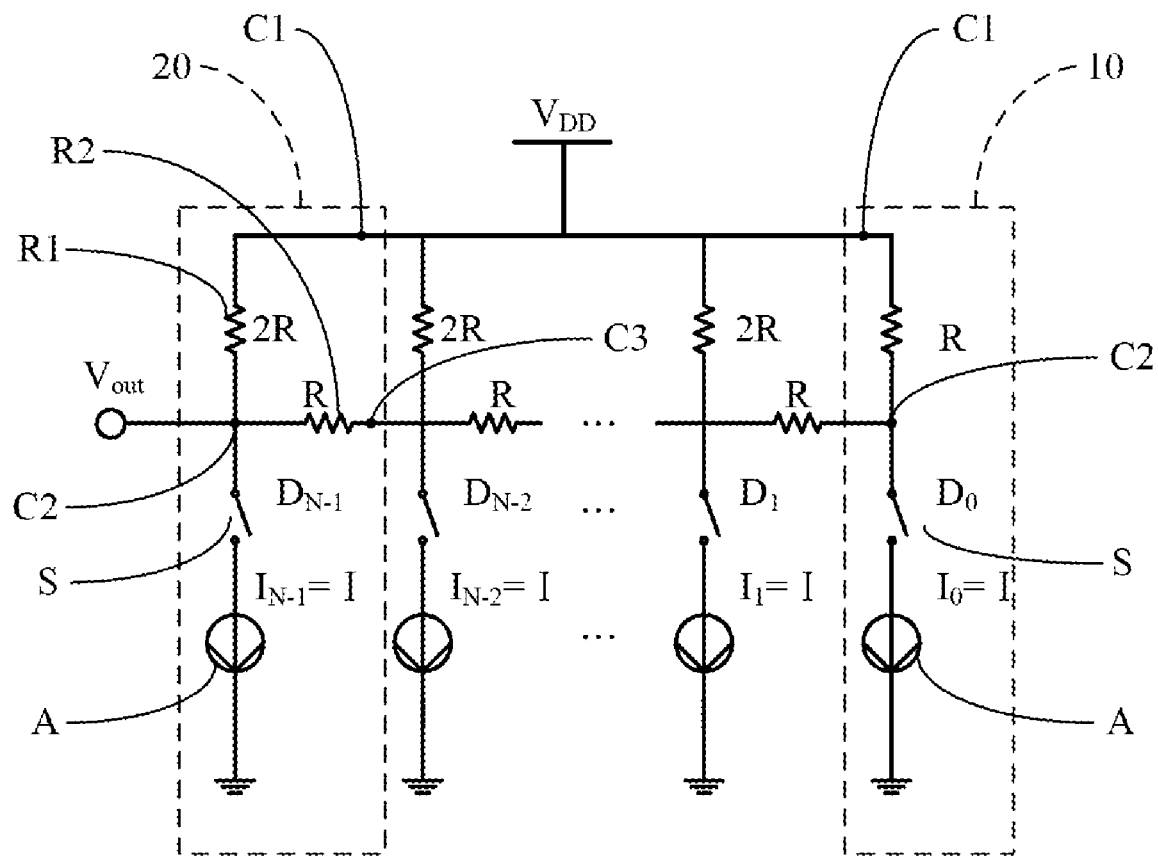
FIG. 1 is a prior-art schematic circuit diagram.
Figure 2:
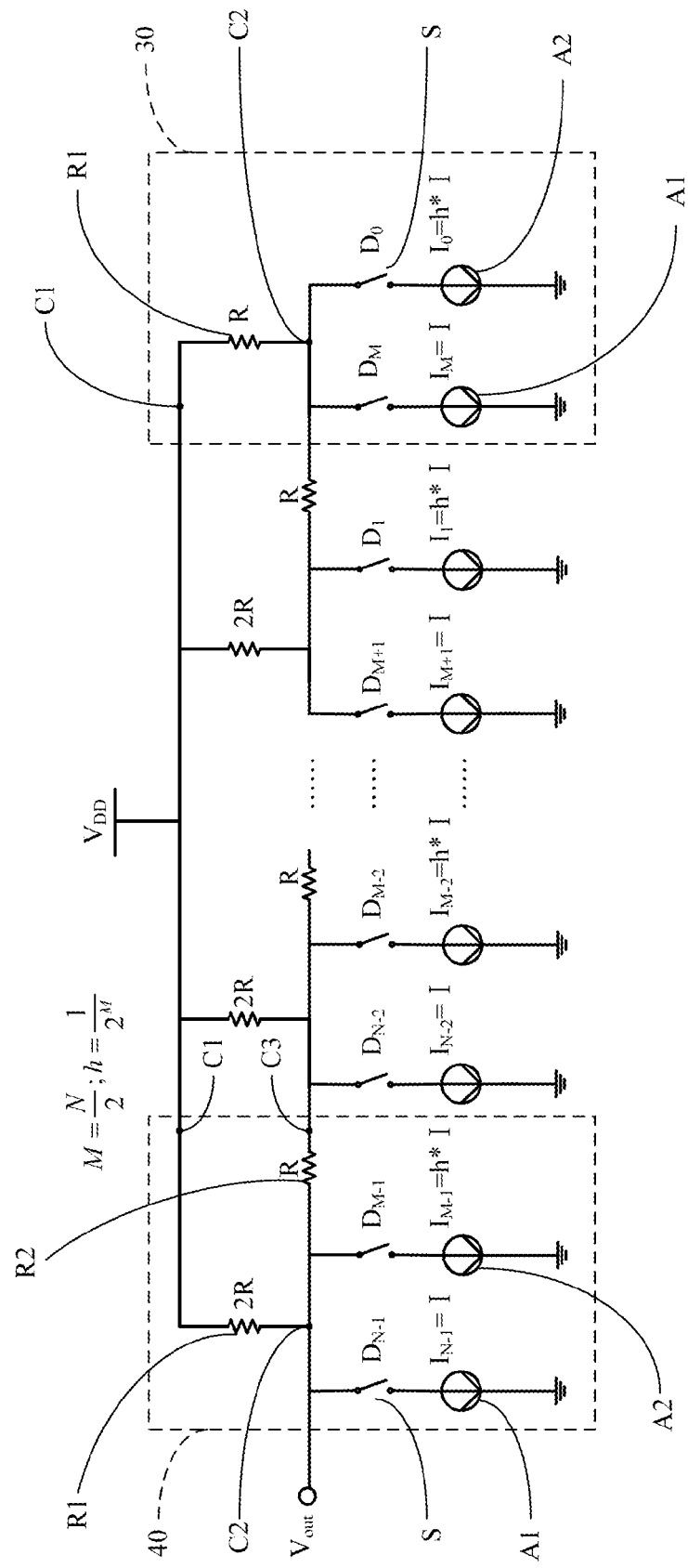
FIG. 2 is a schematic circuit diagram depicting a folded R-2R ladder current-steering digital-to-analog converter according to a first embodiment of the present invention.

A folded R-2R ladder current steering digital-to-analog converter according to a first embodiment of the present invention is shown in FIG. 2, which employs N/2 first weighted current sources and N/2 second weighted current sources to convert N-bit digital information into an analog output. The current steering digital-to-analog converter includes N/2-bit most-significant-bit group to control the N/2 first weighted current source, respectively. The current steering digital-to-analog converter further includes N/2-bit lower—significant-bit group to control the N/2 second weighted current source, respectively. The current steering digital-to-analog converter also includes a R-2R ladder. The folded R-2R ladder of the present invention implies that the first weighted current source and the second weighted current source can simultaneously flow into the R-2R ladder, such that each node in the R-2R ladder includes a first weighed current source and a second weighted current source.

The difference between the folded R-2R ladder digital-to-analog converter of the present invention and a conventional R-2R ladder digital-to-analog converter in structure is that more than one differently weighted input currents correspond to a R-2R set. If a R-2R set has two input current sources: the first weighted current source and the second weighted current source, then there is h times different in weights between them, wherein $$h = \frac{1}{2^M}$$

and $$M = \frac{N}{2}.$$

In this way, there is a $2^M$ difference between the groups of current sources controlled by the lower-significant-bit group ($D_0, D_1, \ldots, D_{M-1}$) and the most-significant-bit group ($D_M, \ldots, D_{N-1}$) in the same R-2R ladder network, which enables the operation of the current-steering digital-to-analog converter. In the case that the current-steering digital-to-analog converter has two input current sources in each node of the R-2R ladder network, the output voltage can be given as:

$$V_{out} = R \cdot \sum_{k=0}^{M-1} D_k \cdot \frac{1}{2^{M-k}} \cdot h \cdot I + R \cdot \sum_{l=M}^{N-1} D_l \cdot \frac{1}{2^{N-l}} \cdot I \quad (1)$$

Accordingly, compared to the conventional R-2R ladder current-steering digital-to-analog converter which provides only one input current source per R-2R set, the folded R-2R ladder current-steering digital-to-analog converter is able to reduce the number of passive components by half, as well as the power consumption.

If there are two input current sources in each node, M equals to N/2; if three input current sources are in each node, M equals to N/3; if four input current sources are in each node, M equals to N/4, and so on. In other words, for two adjacent current sources sequentially arranged in the same R-2R set, there is a M bit(s) difference between signals them, and the inner current values thereof differ by $2^M$ times.

Referring to FIG. 2, the first embodiment of the present invention is a folded R-2R current-steering digital-to-analog converter, including an end current-steering circuit 30 and a plurality of sequentially arranged R-2R current-steering circuits 40. The end current-steering circuit 30 includes: a first electrical contact C1; a first two-ended circuit element R1; a second electrical contact C2 and a plurality of current sources A. The two ends of the first two-ended circuit element R1 electrically couple between the first contact C1 and the second contact C2. The resistance of the first two-ended circuit element R1 between the first contact C1 and the second contact C2 is a first resistance value. Additionally, each current source has a switching element S electrically coupled to the second contact C2, wherein the switching element S controls the current flowing/not flowing through current source A by turning on/off, respectively. Each of the R-2R current-steering circuits includes: a first contact C1, all first contacts are electrically coupled together (in parallel); a first two-ended circuit element R1; a second contact C2; a second two-ended circuit element R2; a third contact C3, wherein the two ends of the second two-ended circuit element R2 are electrically coupled between the second contact C2 and the third contact C3; and a plurality of current sources A. The resistance of the second two-ended circuit element R2 between the second contact C2 and the third contact C3 is a second resistance value. In the R-2R current-steering circuit, the first resistance value is two times the second resistance value. The first resistance value in a R-2R current-steering circuit is two times the first resistance value in the end current-steering circuit.

Prior to arranging with the end current-steering circuit 30, the plurality of sequential R-2R current-steering circuits 40 form a sequential R-2R circuit network, wherein the third contact C3 of each current-steering circuit electrically couples to the second contact C2 of the following current-steering circuit.

The switching element S in each current-steering circuit electrically couples to an input signal (e.g. one of $D_0$, $D_1, \ldots, D_{M-1}, D_M, D_{M+1}, \ldots, D_{N-1}$), respectively, and are switched according to the bit input signals. These bit input signals constitute a plurality-bit binary input value. Thus, the voltage value outputted at the second contact C2 of the first current-steering circuit is an analog output value converted according to the binary input value.

For any arbitrary two current-steering circuits above, for example, the first and second current-steering circuits, the above bit input signals include: a first bit input signal providing a binary value of a first bit to the switch S of a first current source, when the switch S of the first current source is turned on, the inner current of the first current source is a first current value, wherein the first current source resides in the first current-steering circuit; a second bit input signal providing a binary value of a second bit to the switch S of a second current source, when the switch S of the second current source is turned on, the inner current of the second current source is a second current value, wherein the second current source resides in the first current-steering circuit; a third bit input signal providing a binary value of a third bit to the switch S of a third current source, when the switch S of the third current source is turned on, the inner current of the third current source is a third current value, wherein the third current source resides in the second current-steering circuit; and a fourth bit input signal providing a binary value of a fourth bit to the switch S of a fourth current source, when the switch S of the fourth current source is turned on, the inner current of the fourth current source is a fourth current value, wherein the fourth current source resides in the second current-steering circuit.

In other words, the first and second current sources can be arbitrary two current sources in the first current-steering circuit, and the third and fourth current sources can be two current sources in the second current-steering circuit corresponding to the first and second current sources. Thus, there can be additional current source(s) electrically coupled (either at the front or back) to the same contact C2 of the above two current sources.

Accordingly, in a preferred embodiment of the present invention, the first current value is equal to the third current value; the second current value equals to the fourth current value; and the first and second current-steering circuits are adjacent circuits arranged next to each other. Thus, the first bit and third bit can be two adjacent bits in a binary input value, while the second bit and fourth bit can be two adjacent bits in the binary input value. Thus, the first bit and the second bit can be the first bit position and the second bit position in the binary input value, respectively. The distance between the first bit position and the second bit position is offset by M. Moreover, the first current value is $2^M$ times the second current value.

As mentioned before, additional current sources can be electrically coupled to, at the front/back, the same second contact C2 of the above two current sources. In a preferred embodiment of the present invention, the plurality of bit input signals further include: a fifth bit input signal providing a binary value of a fifth bit to the switch S of a fifth current source, when the switch S of the fifth current source is turned on, the inner current of the fifth current source is a fifth current value, wherein the fifth current source resides in the first current-steering circuit. The fifth bit is a third bit position in the binary input value. The distance between the first bit position and the third bit position is offset by M. Moreover, the fifth current value is $2^M$ times the second current value. Conversely, the plurality of bit input signals further include: a sixth bit input signal providing a binary value of a sixth bit to the switch S of a sixth current source, when the switch S of the sixth current source is turned on, the inner current of the sixth current source is a sixth current value, wherein the sixth current source also resides in the first current-steering circuit. The sixth bit is a fourth bit position in the binary input value. The distance between the second bit position and the fourth bit position is offset by M. Moreover, the second current value is $2^M$ times the sixth current value.

Figure 3:
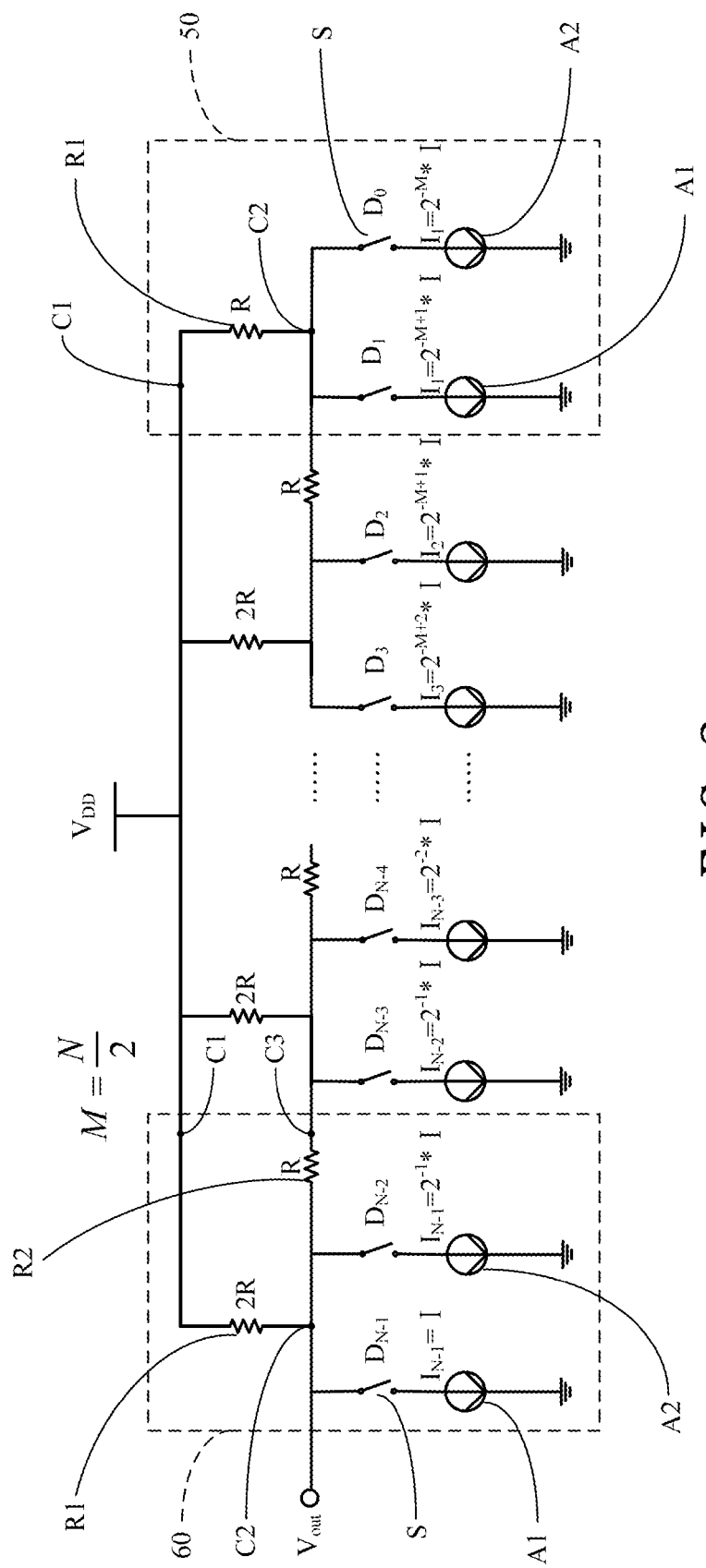
FIG. 3 is a schematic circuit diagram depicting a folded R-2R ladder current-steering digital-to-analog converter according to a second embodiment of the present invention.

A second embodiment of the present invention is a virtual binary folded R-2R current-steering digital-to-analog converter. As shown in FIG. 3, the circuit uses the "folded" concept as the basis for the inventive circuit herein, that is, one set of the R-2R ladder network has more than one differently weighted input current sources. However, the difference between the first and the second embodiments is in the way the inputs bits are arranged and the current weighted values. In the virtual binary folded R-2R current-steering digital-to-analog converter, the highest weighted bit is arranged in the R-2R set closest to the output end; the second highest weighted bit is arranged also in the same R-2R set; and the third and fourth highest weighted value are arranged in the second R-2R set. The bits are arranged in this way from the highest to the lowest weighted value. As known from prior R-2R ladder current-steering digital-to-analog converter, it exhibits binary characteristic as long as the current sources in two adjacent R-2R sets have the same weight. Thus, it can be understood that in the virtual binary folded R-2R current-steering digital-to-analog converter, current sources in adjacent R-2R sets must have the same weight, while the current source of a different weighted bit in the same R-2R set must obviously have a two-bit weight in order to exhibit the binary characteristic. In other words, each of the two adjacent R-2R sets will have a current source with the same weight and another with a different weight. In addition, more than two differently weighted current sources can be inputted into the same R-2R set.

Referring to FIG. 3, the second embodiment of the present invention is a folded R-2R current-steering digital-to-analog converter, including an end current-steering circuit 50 and a plurality of sequentially arranged R-2R current-steering circuits 60. The end current-steering circuit 50 includes: a first electrical contact C1; a first two-ended circuit element R1; a second electrical contact C2 and a plurality of current sources A. The two ends of the first two-ended circuit element R1 electrically couple between the first contact C1 and the second contact C2. The resistance of the first two-ended circuit element R1 between the first contact C1 and the second contact C2 is a first resistance value. Additionally, each current source has a switching element S electrically coupled to the second contact C2, wherein the switching element S controls the current flowing/not flowing through current source A by turning on/off, respectively. Each of the R-2R current-steering circuits 60 includes: a first contact C1, all first contacts are electrically coupled together (in parallel); a first two-ended circuit element R1; a second contact C2; a second two-ended circuit element R2; a third contact C3, wherein the two ends of the second two-ended circuit element R2 are electrically coupled between the second contact C2 and the third contact C3; and a plurality of current sources A. The resistance of the second two-ended circuit element R2 between the second contact C2 and the third contact C3 is a second resistance value. In the R-2R current-steering circuit, the first resistance value is two times the second resistance value. The first resistance value in a R-2R current-steering circuit is two times the first resistance value in the end current-steering circuit. Furthermore, each current-steering circuit and its following current-steering circuit respectively has a current source with the same weight, and each current-steering circuit has at least one current source A with a weight different from any of the weights of all the current sources A in the following current-steering circuit.

Prior to arranging with the end current-steering circuit 50, the plurality of sequential R-2R current-steering circuits 60 form a sequential R-2R circuit network, wherein the third contact C3 of each current-steering circuit electrically couples to the second contact C2 of the following current-steering circuit.

The switching element S in each current-steering circuit electrically couples to an input signal (e.g. one of $D_0$, $D_1$, ..., $D_{N-2}$, $D_{N-1}$), respectively, and are switched according to the bit input signals. These bit input signals constitute a plurality-bit binary input value. Thus, the voltage value outputted at the second contact C2 of the first current-steering circuit is an analog output value converted according to the binary input value. In a preferred embodiment of the present invention, referring to FIGS. 2 and 3, the plurality of current-steering circuits are arranged from left to right; the first current-steering circuit is the lest most current-steering circuit.

For any arbitrary two current-steering circuits above, for example, the first and second current-steering circuits, the above bit input signals include: a first bit input signal providing a binary value of a first bit to the switch S of a first current source, when the switch S of the first current source is turned on, the inner current of the first current source is a first current value, wherein the first current source resides in the first current-steering circuit; a second bit input signal providing a binary value of a second bit to the switch S of a second current source, when the switch S of the second current source is turned on, the inner current of the second current source is a second current value, wherein the second current source resides in the first current-steering circuit; a third bit input signal providing a binary value of a third bit to the switch S of a third current source, when the switch S of the third current source is turned on, the inner current of the third current source is a third current value, wherein the third current source resides in the second current-steering circuit; and a fourth bit input signal providing a binary value of a fourth bit to the switch S of a fourth current source, when the switch S of the fourth current source is turned on, the inner current of the fourth current source is a fourth current value, wherein the fourth current source resides in the second current-steering circuit.

In other words, the first and second current sources can be any arbitrary two current sources in the first current-steering circuit, and the third and fourth current sources can be two current sources in the second current-steering circuit corresponding to the first and second current sources. Thus, there can be additional current source(s) electrically coupled (either at the front or back) to the same contact C2 of the above two current sources.

The second current value is the same as the third current value; while the first and fourth current values are different from the second and third current values. The first and second current-steering circuits are two current-steering circuits arranged next to each other. Moreover, the first, second, third and fourth bits are four consecutive bits in the binary input value. The first current value is two times the second current value and the third current value is two times the fourth current value.

In other words, the main difference between the first and second embodiments of the present invention is that, in the second embodiment, the switches receive consecutive bits of a binary input value are disposed consecutively; whereas in the first embodiment, the switches receiving two consecutive bits are interlaced. As such, the inner currents of the corresponding current sources are different.

Furthermore, if the second current-steering circuit is the end current-steering circuit, and the second current value is the smallest among the inner currents of all the current sources, the fourth bit is the least significant bit of the binary input value. In addition, if the first bit is the most significant bit of the binary input value, then the second contact C2 of the first current-steering circuit outputs an output signal, which is an analog output signal converted from the binary input value, wherein the first current value is the largest of all.

In addition, the first and second two-ended circuit elements can be of any circuit forms that provide impedance. In a preferred embodiment of the present invention, the first and second two-ended circuit elements are resistors or capacitors.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the inventions as determined by the appended claims when interpreted in accordance with the breath to which they are fairly and legally entitled.

It is understood that several modifications, changes, and substitutions are intended in the foregoing disclosure and in some instances some features of the invention will be employed without a corresponding use of other features. Accordingly, it is appropriate that the appended claims be construed broadly and in a manner consistent with the scope of the invention.

The invention claimed is:

1. A folded R-2R ladder current-steering digital-to-analog conversion circuit, comprising:
    an end current-steering circuit, comprising
        a first electrical contact;
        a first two-ended circuit element;
        a second electrical contact, wherein the two ends of the first two-ended circuit element are electrically coupled between the first contact and the second contact, the resistance of the first two-ended circuit element between the first contact and the second contact being a first resistance value; and
        a plurality of current sources, each current source having a switching element electrically coupled to the second contact, wherein the switching element controls the current flowing through the current source by turning on, and controls the current not flowing through the current source by turning off;
    a plurality of sequentially arranged R-2R current-steering circuits, each comprising:
        a first contact, all first contacts are electrically coupled together;
        a first two-ended circuit element;
        a second contact;
        a second two-ended circuit element;
        a third contact, wherein the two ends of the second two-ended circuit element are electrically coupled between the second contact and the third contact, the resistance of the second two-ended circuit element between the second contact and the third contact being a second resistance value, wherein, in each of the R-2R current-steering circuits, the first resistance value is two times the second resistance value, and the first resistance value in the R-2R current-steering circuit being two times the first resistance value in the end current-steering circuit; and
        a plurality of current sources, wherein prior to arranging with the end current-steering circuit, the plurality of sequentially arranged R-2R current-steering circuits form a sequential R-2R circuit network, wherein the third contact of each current-steering circuit electrically couples to the second contact of the following current-steering circuit.

2. A folded R-2R ladder current-steering digital-to-analog conversion circuit of claim 1, wherein the switching element of each current-steering circuit electrically couples to an input signal and is turned on or off according to the bit input signal, the plurality of bit input signals constituting a plurality-bit binary input value.

3. A folded R-2R ladder current-steering digital-to-analog conversion circuit of claim 2, wherein voltage outputted at the second contact of a first current-steering circuit is an analog output value converted from the binary input value.

4. A folded R-2R ladder current-steering digital-to-analog conversion circuit of claim 2, wherein the plurality of bit input signals comprises:
    a first bit input signal providing a binary value of a first bit to the switching element of a first current source, when the switching element of the first current source being turned on, the inner current of the first current source being a first current value, wherein the first current source resides in the first current-steering circuit;
    a second bit input signal providing a binary value of a second bit to the switching element of a second current source, when the switching element of the second current source being turned on, the inner current of the second current source being a second current value, wherein the second current source resides in the first current-steering circuit;
    a third bit input signal providing a binary value of a third bit to the switching element of a third current source, when the switching element of the third current source being turned on, the inner current of the third current source being a third current value, wherein the third current source resides in the second current-steering circuit; and
    a fourth bit input signal providing a binary value of a fourth bit to the switching element of a fourth current source, when the switching element of the fourth current source being turned on, the inner current of the fourth current source being a fourth current value, wherein the fourth current source resides in the second current-steering circuit.

5. A folded R-2R ladder current-steering digital-to-analog conversion circuit of claim 4, wherein the first current value is equal to the third current value, the second current value equals to the fourth current value, and the first and second current-steering circuits are adjacent current-steering circuits arranged next to each other.

6. A folded R-2R ladder current-steering digital-to-analog conversion circuit of claim 5, wherein the first bit and third bit are two adjacent bits in the binary input value, while the second bit and fourth bit are two adjacent bits in the binary input value.

7. A folded R-2R ladder current-steering digital-to-analog conversion circuit of claim 5, wherein the first bit and the second bit are the first bit position and the second bit position in the binary input value, respectively, the distance between the first bit position and the second bit position being offset by M, and the first current value being $2^M$ times the second current value.

8. A folded R-2R ladder current-steering digital-to-analog conversion circuit of claim 5, wherein the plurality of bit input signals comprises:
a fifth bit input signal providing a binary value of a fifth bit to the switching element of a fifth current source, when the switching element of the fifth current source being turned on, the inner current of the fifth current source being a fifth current value, wherein the fifth current source resides in the first current-steering circuit, wherein the fifth bit is a third bit position in the binary input value, the distance between the first bit position and the third bit position being offset by M, and the fifth current value being $2^M$ times the second current value.

9. A folded R-2R ladder current-steering digital-to-analog conversion circuit of claim 5, wherein the plurality of bit input signals comprises:
a sixth bit input signal providing a binary value of a sixth bit to the switching element of a sixth current source, when the switching element of the sixth current source being turned on, the inner current of the sixth current source being a sixth current value, wherein the sixth current source resides in the first current-steering circuit, wherein the sixth bit being a fourth bit position in the binary input value, the distance between the second bit position and the fourth bit position being offset by M, and the second current value being $2^M$ times the sixth current value.

10. A folded R-2R ladder current-steering digital-to-analog conversion circuit of claim 4, wherein the second current value is the same as the third current value, the first and fourth current values being different from the second and third current values, and the first and second current-steering circuits are two adjacent current-steering circuits arranged next to each other.

11. A folded R-2R ladder current-steering digital-to-analog conversion circuit of claim 10, wherein the first, second, third and fourth bits are four consecutive bits in the binary input value.

12. A folded R-2R ladder current-steering digital-to-analog conversion circuit of claim 10, wherein the first current value is two times the second current value.

13. A folded R-2R ladder current-steering digital-to-analog conversion circuit of claim 10, wherein the third current value is two times the fourth current value.

14. A folded R-2R ladder current-steering digital-to-analog conversion circuit of claim 4, wherein if the second current-steering circuit is the end current-steering circuit, and the second current value is the smallest among the inner currents of all the current sources, the fourth bit is the least significant bit of the binary input value.

15. A folded R-2R ladder current-steering digital-to-analog conversion circuit of claim 4, wherein if the first bit is the most significant bit of the binary input value, then the second contact of the first current-steering circuit outputs an output signal, which is an analog output signal converted from the binary input value.

16. A folded R-2R ladder current-steering digital-to-analog conversion circuit of claim 15, wherein the first current value is the largest of all the inner currents.

17. A virtual binary folded R-2R ladder current-steering digital-to-analog conversion circuit, comprising:
an end current-steering circuit, comprising
a first electrical contact;
a first two-ended circuit element;
a second electrical contact, wherein the two ends of the first two-ended circuit element are electrically coupled between the first contact and the second contact, the resistance of the first two-ended circuit element between the first contact and the second contact being a first resistance value; and
a plurality of current sources, each current source having a switching element electrically coupled to the second contact, wherein the switching element controls the current flowing through the current source by turning on, and controls the current not flowing through the current source by turning off;
a plurality of sequentially arranged R-2R current-steering circuits, each comprising:
a first contact, all first contacts are electrically coupled together;
a first two-ended circuit element;
a second contact;
a second two-ended circuit element;
a third contact, wherein the two ends of the second two-ended circuit element are electrically coupled between the second contact and the third contact, the resistance of the second two-ended circuit element between the second contact and the third contact being a second resistance value, wherein, in each of the R-2R current-steering circuits, the first resistance value is two times the second resistance value and the first resistance value in the R-2R current-steering circuit being two times the first resistance value in the end current-steering circuit; and
a plurality of current sources, wherein prior to arranging with the end current-steering circuit, the plurality of sequentially arranged R-2R current-steering circuits form a sequential R-2R circuit network, wherein the third contact of each current-steering circuit electrically couples to the second contact of the following current-steering circuit, wherein each current-steering circuit and its following current-steering circuit respectively has a current source with the same weight, and each current-steering circuit has at least one current source with a weight different from the weights of all the current sources in the following current-steering circuit.

18. A virtual binary folded R-2R ladder current-steering digital-to-analog conversion circuit of claim 17, wherein the switching element of each current-steering circuit electrically couples to an input signal and is turned on or off according to the bit input signal, the plurality of bit input signals constituting a plurality-bit binary input value.

19. A virtual binary folded R-2R ladder current-steering digital-to-analog conversion circuit of claim 18, wherein voltage outputted at the second contact of a first current-steering circuit is an analog output value converted from the binary input value.

20. A virtual binary folded R-2R ladder current-steering digital-to-analog conversion circuit of claim 18, wherein the plurality of bit input signals comprises:
- a first bit input signal providing a binary value of a first bit to the switching element of a first current source, when the switching element of the first current source being turned on, the inner current of the first current source being a first current value, wherein the first current source resides in the first current-steering circuit;
- a second bit input signal providing a binary value of a second bit to the switching element of a second current source, when the switching element of the second current source being turned on, the inner current of the second current source being a second current value, wherein the second current source resides in the first current-steering circuit;
- a third bit input signal providing a binary value of a third bit to the switching element of a third current source, when the switching element of the third current source being turned on, the inner current of the third current source being a third current value, wherein the third current source resides in the second current-steering circuit; and
- a fourth bit input signal providing a binary value of a fourth bit to the switching element of a fourth current source, when the switching element of the fourth current source being turned on, the inner current of the fourth current source being a fourth current value, wherein the fourth current source resides in the second current-steering circuit.

21. A virtual binary folded R-2R ladder current-steering digital-to-analog conversion circuit of claim 20, wherein the second current value is equal to the third current value, the first and fourth current values being different from the second and third current values, and the first and second current-steering circuits are adjacent current-steering circuits arranged next to each other.

22. A virtual binary folded R-2R ladder current-steering digital-to-analog conversion circuit of claim 20, wherein the first, second, third and fourth bits are four consecutive bits in the binary input value.

23. A virtual binary folded R-2R ladder current-steering digital-to-analog conversion circuit of claim 10, wherein the first current value is two times the second current value.

24. A virtual binary folded R-2R ladder current-steering digital-to-analog conversion circuit of claim 20, wherein the third current value is two times the fourth current value.

25. A virtual binary folded R-2R ladder current-steering digital-to-analog conversion circuit of claim 18, wherein if the second current-steering circuit is the end current-steering circuit, and the second current value is the smallest among the inner currents of all the current sources, the fourth bit is the least significant bit of the binary input value.

26. A virtual binary folded R-2R ladder current-steering digital-to-analog conversion circuit of claim 18, wherein if the first bit is the most significant bit of the binary input value, then the second contact of the first current-steering circuit outputs an output signal, which is an analog output signal converted from the binary input value.

27. A virtual binary folded R-2R ladder current-steering digital-to-analog conversion circuit of claim 26, wherein the first current value is the largest of all the inner currents.

* * * * *